(12) United States Patent
Uematsu

(10) Patent No.: US 9,419,267 B2
(45) Date of Patent: Aug. 16, 2016

(54) BATTERY TERMINAL WITH CURRENT SENSOR

(71) Applicant: YAZAKI CORPORATION, Tokyo (JP)

(72) Inventor: Satoshi Uematsu, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 57 days.

(21) Appl. No.: 13/894,223

(22) Filed: May 14, 2013

(65) Prior Publication Data

US 2013/0252050 A1 Sep. 26, 2013

Related U.S. Application Data

(63) Continuation of application No. PCT/JP2011/076739, filed on Nov. 15, 2011.

(30) Foreign Application Priority Data

Nov. 17, 2010 (JP) ................... 2010-256500
Nov. 17, 2010 (JP) ................... 2010-256501

(51) Int. Cl.
*H01M 2/30* (2006.01)
*H01R 11/28* (2006.01)
*H01R 13/66* (2006.01)
(Continued)

(52) U.S. Cl.
CPC ............. *H01M 2/30* (2013.01); *G01R 31/3696* (2013.01); *H01R 11/287* (2013.01); *H01R 13/6683* (2013.01); *H01R 13/405* (2013.01)

(58) Field of Classification Search
CPC ................... H01M 2/20; H01M 2/30
USPC ................................... 429/121–347
See application file for complete search history.

(56) References Cited

U.S. PATENT DOCUMENTS 6,551,147 B2 4/2003 Wakata et al.
7,344,420 B2 3/2008 Tokunaga
7,381,101 B2 6/2008 Roset et al.
(Continued)

FOREIGN PATENT DOCUMENTS

CN 1399725 A 2/2003
DE 102004007851 A1 9/2005
(Continued)

OTHER PUBLICATIONS

Korean Office Action for the related Korean Patent Application No. 10-2013-7012527 dated Aug. 28, 2014.
(Continued)

*Primary Examiner* — James Lee
(74) *Attorney, Agent, or Firm* — Kenealy Vaidya LLP

(57) ABSTRACT

A battery terminal with current sensor includes: a battery terminal part that is formed by a conductive metal plate, and that includes a post part to be connected to a battery post of a battery; a current sensor that is integrated with the battery terminal part by a resin molding, and that includes a stud part to be connected to a load; and a sensor part that corresponds to an integrated part of the battery terminal part and the current sensor. The sensor part includes a penetration portion having a hole or slit shape that is formed at a part to be resin-molded of the battery terminal part, and a filling portion that is formed at a resin-molded part of the current sensor and fills the penetration portion.

13 Claims, 7 Drawing Sheets

(51) Int. Cl.
*G01R 31/36* (2006.01)
*H01R 13/405* (2006.01)

(56) References Cited

U.S. PATENT DOCUMENTS

| | | | |
|---|---|---|---|
| 7,500,888 | B2 | 3/2009 | Roset et al. |
| 8,317,549 | B2 | 11/2012 | Falchetti |
| 2002/0051906 | A1 | 5/2002 | Wakata et al. |
| 2003/0001559 | A1 | 1/2003 | Goto et al. |
| 2003/0099230 | A1 | 5/2003 | Wenk |
| 2003/0198867 | A1* | 10/2003 | Kim ............... H01M 2/305 429/178 |
| 2006/0057899 | A1 | 3/2006 | Tokunaga |
| 2006/0216800 | A1* | 9/2006 | Ishihara et al. ............ 435/135 |
| 2008/0050985 | A1 | 2/2008 | Roset et al. |
| 2008/0194152 | A1 | 8/2008 | Roset et al. |
| 2009/0184683 | A1 | 7/2009 | Abe |
| 2010/0066351 | A1 | 3/2010 | Condamin et al. |
| 2010/0259255 | A1 | 10/2010 | Hashio et al. |
| 2011/0062945 | A1 | 3/2011 | Condamin et al. |
| 2011/0195615 | A1 | 8/2011 | Falchetti |
| 2013/0040177 | A1 | 2/2013 | Hashio et al. |

FOREIGN PATENT DOCUMENTS

| | | |
|---|---|---|
| GB | 2441211 A | 2/2008 |
| JP | 2002-141054 A | 5/2002 |
| JP | 2002-184387 A | 6/2002 |
| JP | 2003-4774 A | 1/2003 |
| JP | 2006-40796 A | 2/2006 |
| JP | 2008-97903 A | 4/2008 |
| JP | 2008-524568 A | 7/2008 |
| JP | 2009-177903 A | 8/2009 |
| JP | 2009-193708 A | 8/2009 |
| JP | 2010-33920 A | 2/2010 |
| JP | 2010-55819 A | 3/2010 |
| JP | 2010-181184 A | 8/2010 |
| JP | 2010-243440 A | 10/2010 |
| JP | 2011-175884 A | 9/2011 |
| JP | 2011-249307 A | 12/2011 |
| WO | WO2010/044111 A1 | 4/2010 |

OTHER PUBLICATIONS

International Search Report and Written Opinion of the International Search Report for PCT/JP2011/076739 dated Mar. 30, 2012.
Japanese Office Action for the related Japanese Patent Application No. 2010-256500 dated Sep. 9, 2014.
Japanese Office Action for the related Japanese Patent Application No. 2010-256501 dated Sep. 9, 2014.
Korean Notice of Allowance for the related Korean Patent Application No. 10-2013-7012527 dated Mar. 24, 2015.
Chinese Office Action and Search Report for the related Chinese Patent Application No. 201180055514.1 dated Jan. 7, 2015.
Japanese Office Action for the related Japanese Patent Application No. 2010-256501 dated Apr. 14, 2015.
Chinese Office Action for the related Chinese Patent Application No. 201180055514.1 dated Jul. 21, 2015.
Chinese Office Action for the related Chinese Patent Application No. 201180055514.1 dated Dec. 29, 2015.

* cited by examiner

BATTERY TERMINAL WITH CURRENT SENSOR

CROSS REFERENCE TO RELATED APPLICATIONS

This application is a continuation of PCT application No. PCT/JP2011/076739, which was filed on Nov. 15, 2011 based on Japanese Patent Application (No. 2010-256500) filed on Nov. 17, 2010 and Japanese Patent Application (No. 2010-256501) filed on Nov. 17, 2010, the contents of which are incorporated herein by reference.

BACKGROUND OF THE INVENTION

1. Field of the Invention

The present invention relates to a battery terminal with current sensor by assembling a current sensor to a battery terminal part.

2. Description of the Related Art

In recent years, as automobiles are highly functionalized, electrical components are also increased in number. It is known that increase of the electrical components causes a drain of an in-vehicle battery more sharply. A battery terminal is connected to a battery post of the battery. The battery terminal is connected with an end terminal of a cable terminal. A current sensor for monitoring a remaining capacity of the battery is assembled to the end terminal. The current sensor has a substantially annular core and a Hall element and is inserted and assembled to the end terminal (for example, refer to JP2002-141054A).

SUMMARY OF THE INVENTION

In the above related art, when connecting the end terminal of the cable terminal to the battery terminal, it is necessary to insert the current sensor into the end terminal to assemble the current sensor. Accordingly, the number of processes is increased, considering the workload until the completion of the connection of the end terminal and the battery terminal.

Further, in the above related art, since the current sensor is assembled to the end terminal, the current sensor must be provided at a position distant from the battery post or the battery. As a result, a relatively large space should be secured around the battery.

Accordingly, the inventor found an idea of integrating the current sensor with the battery terminal by a resin molding. The inventor found that the above problems can be solved by the idea.

The inventor also found that it is necessary to prepare a following countermeasure, in addition to the integration of the current sensor with the battery terminal by the resin molding. That is, the inventor found that after the battery terminal and the current sensor are integrated by the resin molding, which is then connected and fixed to the battery post, it is necessary to prepare a countermeasure with respect to a work of connecting an end terminal of a wire terminal, which is connected to a load, to a stud bolt of the battery terminal. Specifically, when a stress is concentrated on the resin-molded part by high fastening torque, peeling may be caused at a contact part between a metal surface and a resin surface, so that the resin-molded part is separated. Due to the concern, the inventor found that it is necessary to set up a countermeasure to deal with the problem.

When the resin-molded part is separated, the overall outward appearance is deteriorated and also the repetitive use is difficult. Further, the influence due to the vibration or the like may be caused.

The inventor also found that it is necessary to prepare a following countermeasure, in addition to the above countermeasures. In other words, when the battery terminal has a structure in which a conductive metal plate is bent and an upper plate part and a lower plate part thereof are thus opposed to each other, it is not possible to form an embrace part (refer to a reference numeral 22 in FIG. 4 of JP2002-141054A), which prevents the upper plate part and the lower plate part from being widened therebetween, at the integration position of the battery terminal and the current sensor and at a rear position thereof. Hence, a problem may occur which is caused as the upper plate part and the lower plate part are widened therebetween and thus it is necessary to prepare a countermeasure to deal with the problem.

The invention has been made to solve the above problems. An object of the invention is to provide a battery terminal with current sensor capable of preventing an integrated part by a resin molding from being separated. Another object of the invention is to provide a battery terminal with current sensor capable of preventing an upper plate part and a lower plate part from being widened therebetween.

The present invention provides, as one aspect, a battery terminal with current sensor, including: a battery terminal part that is formed by a conductive metal plate, and that includes a post part to be connected to a battery post of a battery; a current sensor that is integrated with the battery terminal part by a resin molding, and that includes a stud part to be connected to a load; and a sensor part that corresponds to an integrated part of the battery terminal part and the current sensor, wherein the sensor part includes a penetration portion having a hole or slit shape that is formed at a part to be resin-molded of the battery terminal part, and a filling portion that is formed at a resin-molded part of the current sensor and fills the penetration portion.

According to the configuration, when the current sensor is integrated with the battery terminal part by the resin molding, a metal surface and a resin surface are contacted tightly to each other and the penetration portion of the battery terminal part is filled by the filling portion of the current sensor. Therefore, even when the peeling occurs at the contact part between the metal surface and the resin surface by the external force, the separation of the resin-molded part is prevented as long as the filled state between the penetration portion and the filling portion, i.e., the engaged state is kept.

The battery terminal with current sensor may be configured so that the sensor part and the stud part are arranged side by side in a direction orthogonal to a longitudinal axis of the battery terminal part.

According to the configuration, the sensor part and the stud part are arranged side by side in a direction orthogonal to the longitudinal axis of the battery terminal part, so that the compact battery terminal with current sensor whose whole length is relatively short is obtained. Therefore, it is possible to secure the compact battery terminal with current sensor in which the resin-molded part is prevented from being separated.

The battery terminal with current sensor may be configured so that the penetration portion and the filling portion are arranged in a predetermined axis passing through the stud part and being parallel with the longitudinal axis of the battery terminal part.

According to the configuration, it is particularly efficient to arrange the sensor part and the stud part side by side in a direction orthogonal to the longitudinal axis of the battery terminal part. Specifically, the battery terminal with current sensor is provided in which even when the high fastening torque is applied to the stud part, the penetration portion and the filling portion are arranged at the positions which are efficient to reduce the influence by the fastening torque.

The battery terminal with current sensor may be configured so that the sensor part and the stud part are arranged side by side along a longitudinal axis of the battery terminal part so that the sensor part is positioned closer to the post part than the stud part.

According to the configuration, the battery terminal with current sensor is provided in which the sensor part is arranged between the post part and the stud part. Even with the configuration, it is possible to prevent the resin-molded part from being separated.

The present invention also provides, as another aspect, a battery terminal with current sensor, including: a battery terminal part that is formed by a conductive metal plate, and a current sensor that is integrated with the battery terminal part by a resin molding, wherein the battery terminal part includes a first plate part and a second plate part, which are opposed to each other by bending the conductive metal plate, a post part that is to be connected to a battery post of a battery and an embrace part that is formed at the post part and restrains the first plate part and the second plate part from being widened therebetween, and a part to be resin-molded, which corresponds to a part to which the current sensor is integrated by the resin molding, and a connection part, which corresponds to a part of connecting the part to be resin-molded to the first plate part, are formed at one side of the embrace part in the first plate part.

According to the configuration, the post part is formed with the embrace part, so that it is possible to restrain the first plate part and the second plate part (e.g., the upper plate part and the lower plate part) from being widened therebetween, regardless of the resin molding position of the current sensor.

The battery terminal with current sensor may be configured so that the connection part is formed so that a width thereof is gradually widened from the one side of the embrace part toward the part to be resin-molded.

According to the configuration, the width of the connection part is widened, so that it is possible to increase the strength of the connection part. Even when the current sensor is integrated to the part to be resin-molded continuing from the connection part, the connection part can sufficiently bear a weight of the current sensor, the vibration, or the like.

The battery terminal with current sensor may be configured so that the connection part is formed with a reinforcement part.

According to the configuration, it is possible to further increase the strength of the connection part. As an example of the reinforcement part, it is preferably to form a bead and the like by embossing the plate-shaped connection part.

According to the configuration based on one of the above aspects, the penetration portion and the filling portion are provided, so that it is possible to prevent the integrated part by the resin molding from being separated. Thereby, it is possible to provide the battery terminal with current sensor capable of preventing the overall outward appearance from being deteriorated, enabling the repetitive use and excluding the influence due to the vibration, or the like.

In addition, it is possible to provide a more favorable battery terminal with current sensor.

According to the configuration based on the other of the above aspects, the post part, which is connected to the battery post of the battery, is formed with the embrace part. Thereby, it is possible to restrain the first plate part and the second plate part (e.g., the upper plate part and the lower plate part) of the battery terminal part from being widened therebetween, even not at the integration position of the current sensor and at a rear position thereof. In addition, since the battery terminal part can prevent the first plate part and the second plate part thereof from being widened therebetween, it is possible to favorably integrate the current sensor thereto.

In addition, it is possible to secure the sufficient strength that is required for the integration of the current sensor.

DETAILED DESCRIPTION OF THE EXEMPLARY EMBODIMENTS

A battery terminal with current sensor includes a battery terminal part formed by a conductive metal plate and a current sensor that is integrated with the battery terminal part by a resin molding. A part to be resin-molded of the battery terminal part is formed with a penetration portion having a hole or slit shape. In addition, a resin-molded part of the current sensor is formed with a filling portion that fills the penetration portion.

In a different standpoint, the battery terminal with current sensor includes a post part that is to be connected to a battery post of a battery and a sensor part in which the battery terminal part and the current sensor are integrated with each other. The post part includes a first plate part and a second plate part (an upper plate part and a lower plate part) and an embrace part that restrains the first and second plate parts from being widened therebetween.

(First Embodiment)

Figure 7:
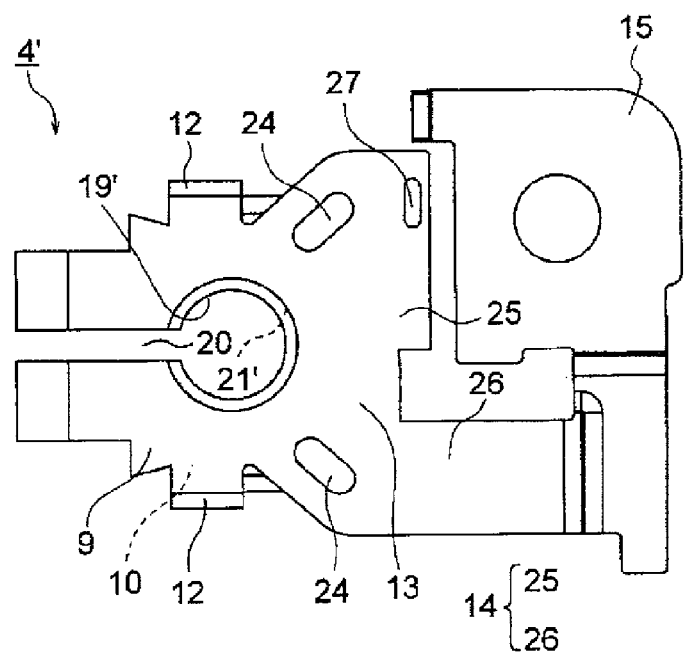
FIG. 7 is a plan view of another battery terminal part according to another illustrative embodiment.

Hereinafter, a first embodiment will be described with reference to the drawings. FIGS. 1A to 4B are plan views, bottom views and perspective views of a battery terminal with current sensor and a battery terminal part configuring a part of the battery terminal with current sensor according to the first embodiment of the invention. FIG. 7 is a plan view of another battery terminal part according to another illustrative embodiment.

Figure 1A:
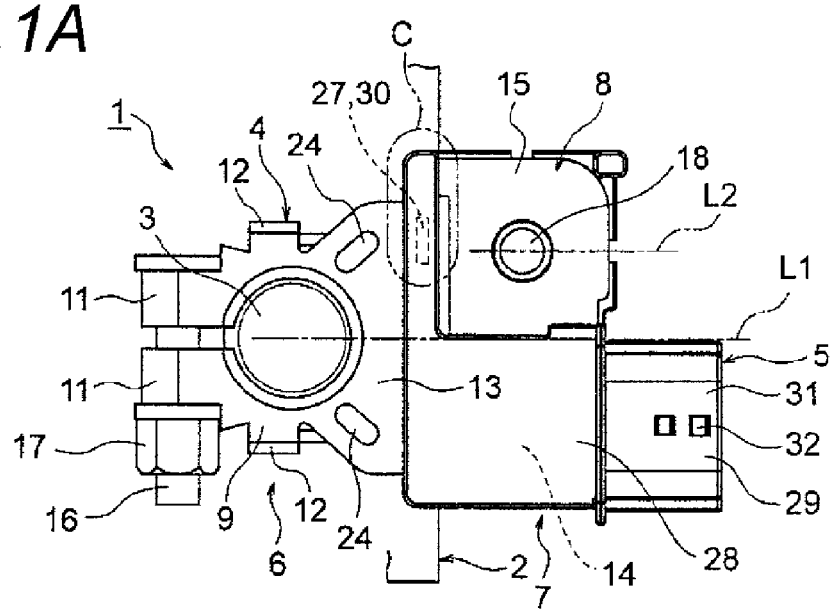
FIG. 1A is a plan view of a battery terminal with current sensor according to a first embodiment of the invention.
Figure 1B:
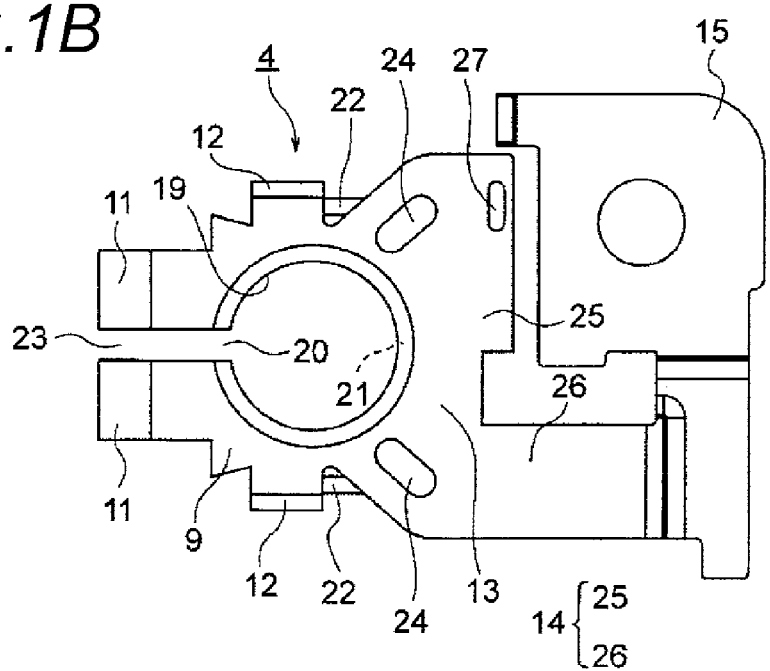
FIG. 1B is a plan view of a battery terminal part according to the first embodiment.
Figure 2A:
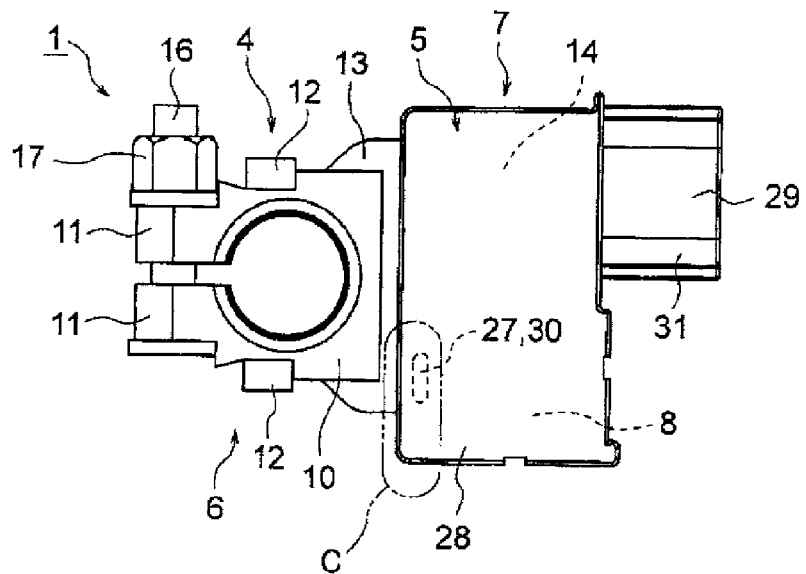
FIG. 2A is a bottom view of the battery terminal with current sensor shown in FIG. 1A.
Figure 2B:
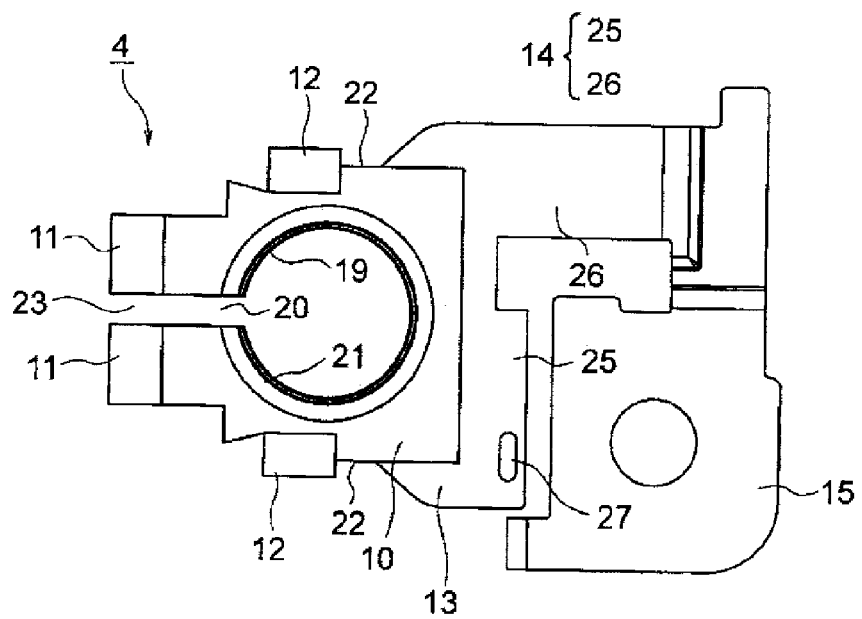
FIG. 2B is a bottom view of the battery terminal part shown in FIG. 1B.
Figure 3A:
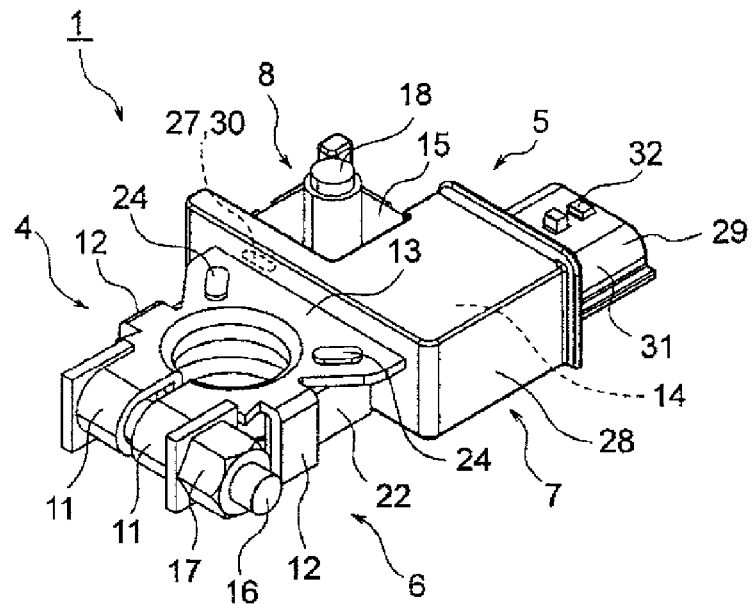
FIG. 3A is a front perspective view of the battery terminal with current sensor shown in FIG. 1A.
Figure 3B:
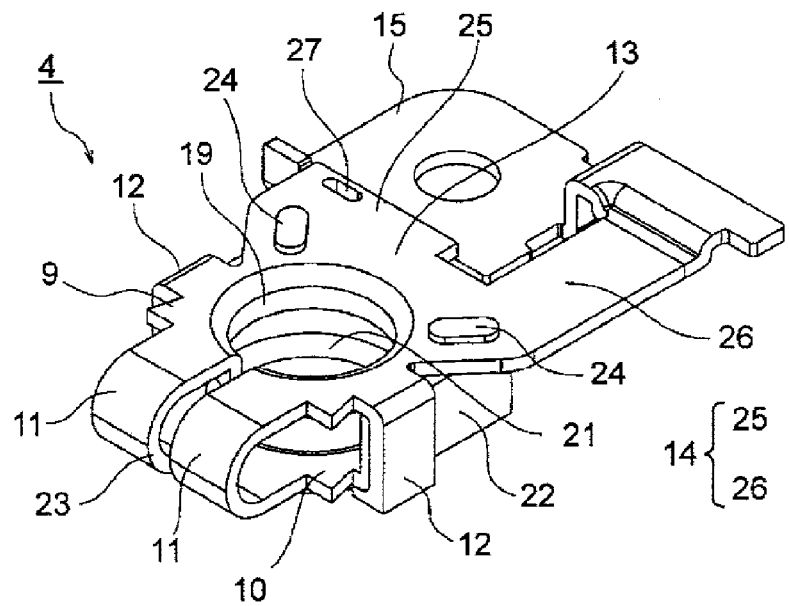
FIG. 3B is a front perspective view of the battery terminal part shown in FIG. 1B.
Figure 4A:
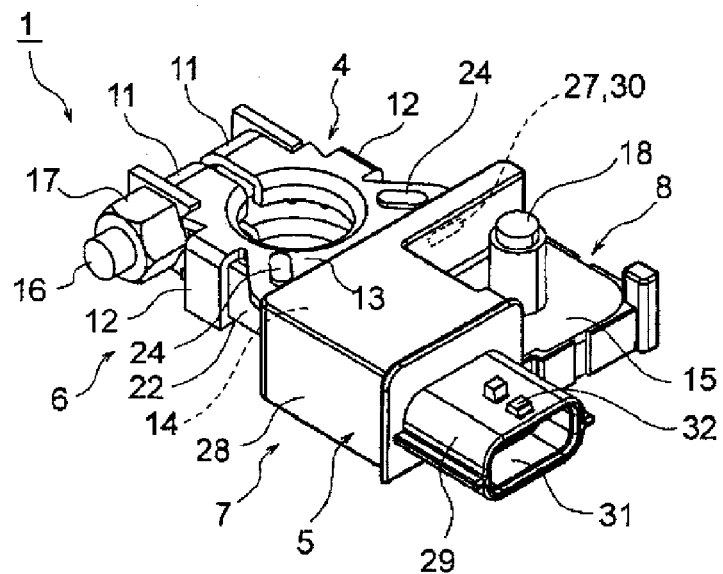
FIG. 4A is a rear perspective view of the battery terminal with current sensor shown in FIG. 1A.
Figure 4B:
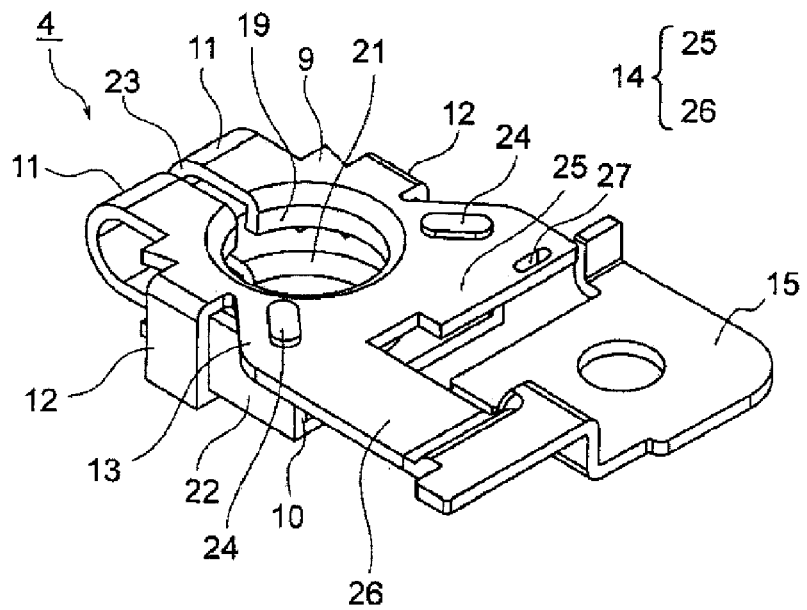
FIG. 4B is a rear perspective view of the battery terminal part shown in FIG. 1B.

FIG. 1 shows a battery terminal 1 with current sensor. The battery terminal 1 with current sensor has a battery terminal part 4 that is connected to a battery post 3 of a battery 2 to be mounted on a moving body such as automobile, and a current sensor 5 that is integrated with the battery terminal part 4 by a resin molding, but the configuration of the battery terminal 1 with current sensor is not limited thereto.

The battery terminal 1 with current sensor has such a configuration so that a part to be connected to the battery post 3 corresponds to a post part 6 of the battery terminal 4, an integrated part of the battery terminal part 4 and the current sensor 5 corresponds to a sensor part 7, and a connection part of a load corresponds to a stud part 8 of the current sensor 5. In the first embodiment, the sensor part 7 and the stub part 8 are arranged side by side in a direction orthogonal to a longitudinal axis L1 of the battery terminal part 4 (another example will be described in a second embodiment). As the sensor part 7 and the stud part 8 are arranged as described above, the battery terminal 1 with current sensor has a relatively short whole length to be compact.

As can be seen from the below descriptions, the battery terminal 1 with current sensor has such a structure that a resin-molded part surrounded by a reference numeral C cannot be separated. By this structure, it is possible to prevent the overall outward appearance from being deteriorated, to enable the repetitive use and to exclude the influence due to the vibration, or the like.

First, the battery 2, the battery terminal part 4 and the current sensor 5 are specifically described.

The battery 2 has an upper surface, a lower surface and a plurality of side surfaces and is provided with the battery post 3 that protrudes from the upper surface. The upper surface is a surface on which the battery post 3 is mounted to stand. The battery post 3 has a substantially conical shape in trapezoidal cross section having a tapered peripheral side surface in which a diameter of a leading end is smaller than that of a base end. In the first embodiment, the battery terminal part 4 that can be connected and fixed to the battery post 3 (minus side) having the above shape is used.

In FIGS. 1A to 4B, the battery terminal part 4 is formed into the shown shape by pressing a conductive metal plate. In the first embodiment, the metal plate is Sn-plated. The battery terminal part 4 has an upper plate part 9 and a lower plate part 10 (first and second plate parts), which are opposed to each other, a pair of fastening parts 11, 11, a pair of embrace parts 12, 12, a connection part 13, a plate-shaped part to be resin-molded 14 (or a part to be resin-molded) and an end terminal connection part 15. In addition, the battery terminal part 4 has a fastening bolt 16, a nut 17 that is screwed to the fastening bolt 16 and a stud bolt 18 for end terminal connection that is mounted to stand on the end terminal connection part 15.

In the first embodiment, an axial direction of the battery post 3 is defined as an upper-lower direction. Also, the leading end and base end of the battery post 3 are respectively defined as above and below. Hence, the upper plate part 9 is arranged above the lower plate part 10. A direction orthogonal to the upper-lower direction is defined as a left-right direction. The left-right direction coincides with an arrangement direction of the sensor part 7 and the stud part 8 or a fastening direction by the fastening bolt 16 and the nut 17. In addition, a direction orthogonal to the upper-lower direction and the left-right direction is defined as a front-rear direction. The front-rear direction coincides with the longitudinal axis L1 of the battery terminal part 4. Regarding the front-rear direction, a battery post 3-side is defined as a front.

The upper plate part 9 and the lower plate part 10 of the battery terminal part 4 are opposed to each other in the upper-lower direction by punching a metal plate and bending the pair of fastening parts 11, 11.

The upper plate part 9 has a battery post insertion hole 19 at its substantial center. The battery post insertion hole 19 is to insert the battery post 3 therein and is penetrated in the upper-lower direction.

The embrace parts 12 having a substantial L shape, each of which extends in the lower direction and has a leading end bent inwards and engaged to a lower surface of the lower plate part 10, are respectively connected to left and right end portions of the upper plate part 9. The pair of embrace parts 12, 12 is provided to prevent the upper plate part 9 and the lower plate part 10 arranged at a predetermined interval from being widened therebetween. In the meantime, the pair of embrace parts 12, 12 is not limited to the above. That is, embrace parts may have such a structure that they are connected to the left and right end portions of the lower plate part 10 and thus embrace the upper plate part 9.

The battery post insertion hole 19 contacts the peripheral side surface of the battery post 3 and is formed so that a lip thereof is bent from the upper plate part 9 to face downwards. The battery post insertion hole 19 is annularly formed in conformity with a diameter of the leading end of the battery post 3. The battery post insertion hole 19 is formed so that a part between the pair of fastening parts 11, 11 is divided. A reference numeral 20 indicates the dividing part of the battery post insertion hole 19.

The lower plate part 10 has a battery post insertion hole 21 at its substantial center. The battery post insertion hole 21 is to insert the battery post 3 therein and is penetrated in the upper-lower direction.

The pair of embrace parts 12, 12 is engaged at left and right end portions of the lower plate part 10. Also, the left and right end portions of the lower plate part 10 are connected with sidewalls 22, each of which extends in the upper direction and has a leading end contacting a lower surface of the upper plate part 9. The pair of sidewalls 22 is provided to prevent the upper plate part 9 and the lower plate part 10 from being narrowed (approached) and to thus keep the predetermined interval therebetween. The pair of sidewalls 22 is formed so that they are embraced by the pair of embrace parts 12, 12.

The battery post insertion hole 21 contact the peripheral side surface of the battery post 3 and is formed so that a lip thereof is bent from the lower plate part 10 to face downwards, like the battery post insertion hole 19. The battery post insertion hole 21 is annularly formed in conformity with a diameter of a base end of the battery post 3. The battery post insertion hole 21 is formed so that a part between the pair of fastening parts 11, 11 is divided. In the meantime, the dividing part of the battery post insertion hole 21 is formed to be same as the dividing part 20 just below thereof (hence, the same reference numeral 20 is used).

The fastening parts 11, 11 connect the upper plate part 9 and the lower plate part 10 so that the upper and lower plate parts overlap with each other in the upper-lower direction at the predetermined interval, and are formed by bending the same into a U shape in the front-rear direction. The fastening parts 11, 11 have upper ends that are connected to a front end of the upper plate part 9 (they are connected at left and right sides of the upper dividing part 20). Also, the fastening parts 11, 11 have lower ends that are connected to a front end of the lower plate part 10 (they are connected at left and right sides of the lower dividing part 20). The fastening parts 11, 11 have a fastening gap 23 that communicates with the dividing parts 20, 20, and are provided side by side in the left-right direction. A bolt insertion penetration hole (its reference numeral is omitted) is formed inside each of the fastening parts 11, 11.

The fastening bolt 16 is inserted in the bolt insertion penetration holes of the fastening parts 11, 11. The fastening bolt

16 is inserted while crossing the fastening gap 23. The fastening bolt 16 has a function of fastening the fastening parts 11, 11 positioned at both sides of the fastening gap 23 in a direction of coming close to each other in cooperation with the nut 17 screwed on a shaft leading end of the fastening bolt (when the fastening parts are fastened, the diameters of the battery post insertion holes 19, 21 are reduced). A head part of the fastening bolt 16 is contacted to rotation prevention parts (reference numerals thereof are omitted) of the upper plate part 9 and the lower plate part 10 and thus rotation-prevented.

The connection part 13 continues the upper plate part 9 and the plate-shaped part to be resin-molded 14. The connection part 13 straightly extends from the upper plate part 9. The connection part 13 has a substantially tapered shape whose width is gradually increased from the base end positions of the embraces 12, 12 toward the plate-shaped part to be resin-molded 14. In the meantime, the tapered shape having the wide width is to secure the sufficient strength. Regarding the strength secure, it is efficient to form beads 24 (reinforcement parts) by performing an embossing process for the connection part 13 (the invention is not limited to the beads and the other reinforcement parts may be possible inasmuch as they can increase the strength). The beads 24 are arranged at positions that are apt to be influenced by vibration, or the like. The pair of sidewalls 22 is arranged to contact the lower surface of the connection part 13. Therefore, the connection part 13 is not further shaken well.

The plate-shaped part to be resin-molded 14 is a part to which the current sensor 5 is integrated by the resin molding, and has a front end-side part to be resin-molded 25 and a bus bar-shaped part to be resin-molded 26. In the meantime, regarding the term 'plate shape' of the plate-shaped part to be resin-molded 14, in the first embodiment, since the part to be resin-molded has a plate shape, the part to be resin-molded is called as the plate-shaped part to be resin-molded. However, the invention is not limited to the plate shape.

The front end-side part to be resin-molded 25 corresponds to a substantial outer periphery edge part which continues from a rear end of the connection part 13 and extends in the left-right direction. Also, the front end-side part to be resin-molded 25 shortly extends in the front-rear direction. Since the front end-side part to be resin-molded 25 has the above shape, it has a smaller area in the front-rear direction (when the current sensor 5 is integrated, a contact area between the metal surface and the resin surface is reduced). The front end-side part to be resin-molded 25 is formed with a penetration portion 27 as a part for preventing the separation of the resin-molded part C.

The penetration portion 27 is a hole that is penetrated in the upper-lower direction, and has an elliptical shape, in the first embodiment. In the meantime, the shape of the penetration portion 27 is not particularly limited insofar as it can prevent the separation of the resin-molded part C. For example, a circular hole, a rectangle hole or a slit is also possible. Also, two or more penetration portions may be arranged. In this illustrative embodiment, the penetration portion 27 is arranged on an axis L2 (this is just exemplary). The axis L2 is an axis line that passes through the stud bolt 18 of the stud part 8 and is parallel with the longitudinal axis L1 of the battery terminal part 4). Also, in the first embodiment, the penetration portion 27 is arranged near the stud part 8. In other words, the penetration portion 27 is arranged at a position to which force is first applied when fastening.

The bus bar-shaped part to be resin-molded 26 has an end that is connected to the front-side part to be resin-molded 25. In the first embodiment, the connection position is distant from the penetration portion 27. Also, the other end of the bus bar-shaped part to be resin-molded 26 is connected to an end terminal connection part 15 that configures the stud part 8. The bus bar-shaped part to be resin-molded 26 has a desired path. In the first embodiment, the path is set to provide the compact battery terminal 1 with current sensor having a relatively short whole length (that is, the battery terminal 1 with current sensor having a relatively shorter whole length, compared to a second embodiment that will be described later).

The end terminal connection part 15 and the stub bolt 18 standing therefrom configure the stud part 8, which is a connection part of a load (not shown). Specifically, the stud part is configured so that an end terminal of a cable terminal (not shown) can be connected and fixed thereto (a nut (not shown) is fastened to the stud bolt 18 and the end terminal is pressed, connected and fixed to the end terminal connection part 15 by the fastening).

The current sensor 5 is provided to monitor a remaining capacity of the battery 2 and is integrated and assembled to the plate-shaped part to be resin-molded 14 of the battery terminal part 4 by an insert molding. The current sensor 5 having the above shape has a sensor block 28 that has therein a current sensing circuit part of a chip type (not shown) and a connector part 29 that is connected to the sensor block 28.

The current sensing circuit part (not shown) is arranged to the position of the bus bar-shaped part to be resin-molded 26. In the first embodiment, a coreless type having no core and no Hall element is used as the current sensor 5.

The sensor block 28 is molded to embed the plate-shaped part to be resin-molded 14 and a lower surface of the end terminal connection part 15 by the insert molding. Most of the sensor block 28 is formed as a resin-molded part of the current sensor 5. The sensor block 28 is formed with a filling portion 30 that fills the penetration portion 27 of the battery terminal part 4 with resin by the insert molding. When external force due to some causes is applied, the filling portion 30 is caught in the penetration portion 27 (engaged by the filling). Thereby, the filling portion prevents the sensor block 28 (resin-molded part C) from being separated from the front end-side part to be resin-molded 25 of the plate-shaped part to be resin-molded 14.

The connector part 29 has a housing 31 and a plurality of end terminal fittings (not shown) that is provided in the housing 31. A lock part 32 that is fitted with a mating connector (not shown) is formed on an outer side of the housing 31.

In the below, a method of connecting the battery terminal 1 with current sensor to the battery post 3 is described based on the above configuration and structure.

For connection to the battery post 3, the battery terminal 1 with current sensor is moved downwards and the battery post insertion holes 19, 21 are brought into contact with the peripheral side surface of the battery post 3. Then, a direction of the battery terminal 1 with current sensor is arranged to a predetermined direction. Subsequently, the nut 17 is fastened by a tool (not shown) such as impact wrench from a lateral direction of the battery terminal 1 with current sensor. Thereby, the battery post insertion holes 19, 21 are decreased to reduce the diameters thereof, so that the battery post insertion holes 19, 21 are pressed and contacted to the peripheral side surface of the battery post 3. As a result, the connection of the battery terminal 1 with current sensor is completed.

Regarding the battery terminal 1 with current sensor that is connected to the battery post 3, when an end terminal of a cable terminal (not shown) is connected and fixed to the stud part 8, the relatively high force, which is caused due to the fastening of a nut (not shown), is applied to the integrated part of the battery terminal part 4 and the current sensor 5. However, since the battery terminal 1 with current sensor has the penetration portion 27 and the filling portion 30, the sensor block 28 (resin-molded part C) is not separated from the front end-side part to be resin-molded 25.

As described above with reference to FIGS. 1A to 4B, the battery terminal 1 with current sensor can prevent the sensor block 28 (resin-molded part C) from being separated from the front end-side part to be resin-molded 25. Accordingly, it is possible to prevent the overall outward appearance from being deteriorated, to enable the repetitive use and to exclude the influence due to the vibration, or the like.

Also, as described above with reference to FIGS. 1A to 4B, the battery terminal 1 with current sensor has the embrace parts 12 at the post part 6 that is connected to the battery post 3 of the battery 2. Thereby, it is possible to restrain (prevent) the upper plate part 9 and the lower plate part 10 of the battery terminal part 4 from being widened therebetween, even not at the integration position of the current sensor 5 and at a rear position thereof. In addition, since the battery terminal part 4 can prevent the upper plate part 9 and the lower plate part 10 thereof being widened therebetween, it is possible to favorably integrate the current sensor 5 thereto.

In the meantime, the battery terminal part 4 is not limited to the shape shown in FIGS. 1A to 4B and may have a shape as shown in FIG. 7. That is, a battery terminal part 4' having battery post insertion holes 19', 21' having smaller diameters whose outward appearance is not changed is also possible. The battery terminal part 4' in FIG. 7 is used in correspondence to a battery having a thinner battery post. However, it has the same outward appearance as the battery terminal part 4, so that it is not necessary to newly prepare a mold. That it, there is a merit of commonly using the mold.

(Second Embodiment)

Figure 5:
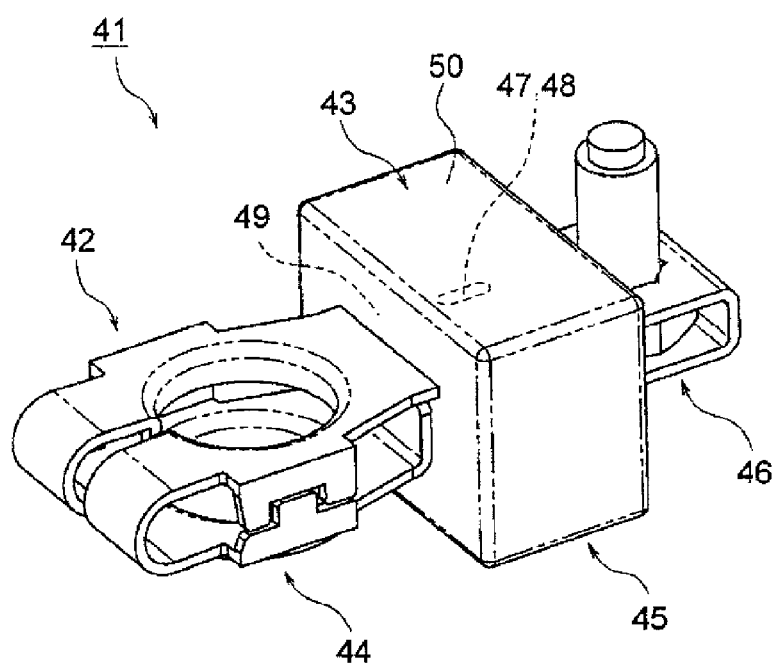
FIG. 5 is a perspective view of a battery terminal with current sensor according to a second embodiment of the invention.

Hereinafter, a second embodiment will be described with reference to the drawings. FIG. 5 is a perspective view of a battery terminal with current sensor according to the second embodiment of the invention. In addition, FIG. 6A is a plan view of the battery terminal with current sensor of FIG. 5 and FIG. 6B is a plan view of a battery terminal part of FIG. 5.

Figure 6A:
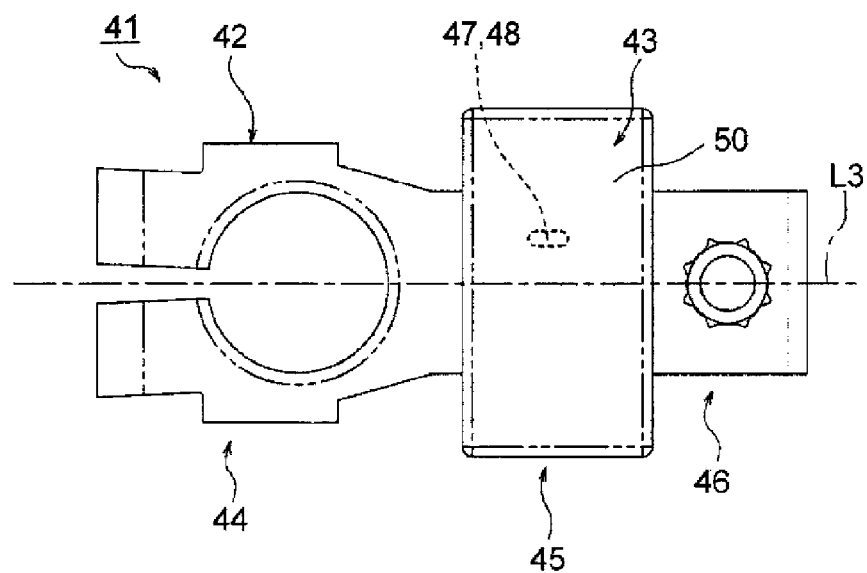
FIG. 6A is a plan view of the battery terminal with current sensor shown in FIG. 5.
Figure 6B:
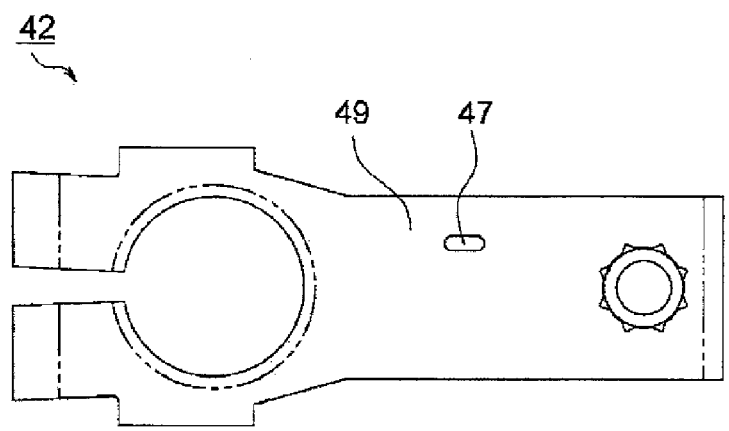
FIG. 6B is a plan view of a battery terminal part shown in FIG. 5.

FIGS. 5, 6A and 6B show a battery terminal 41 having a current sensor according to the second embodiment. The battery terminal 41 with current sensor has a battery terminal part 42 that is connected to the battery post 3 of the battery 2 (refer to FIG. 1) and a current sensor 43 that is integrated with the battery terminal part 42 by the resin molding.

The battery terminal part 41 with current sensor has a post part 44 of the battery terminal part 42 that is a part to be connected to the battery post 3 (refer to FIG. 1), a sensor part 45 that is an integrated part of the battery terminal part 42 and the current sensor 43 and a stud part 46 of the current sensor 43 that is a connection part to a load. The sensor part 45 is arranged between the post part 44 and the stud part 46. In the second embodiment, the post part 44, the sensor part 45 and the stud part 46 are arranged side by side along an axis L3 of the battery terminal 41 with current sensor. The respective functions of the post part 44, the sensor part 45 and the stud part 46 are the same as those of the first embodiment and the descriptions thereof are thus omitted.

The battery terminal 41 with current sensor has a penetration portion 47 and a filling portion 48 at the sensor part 45. The penetration portion 47 is formed at a plate-shaped part to be resin-molded 49 (a part to be resin-molded) of the battery terminal part 42. Also, the filling portion 48 is formed at the sensor block 50 of the current sensor 43. In the meantime, the penetration portion 47 and the filling portion 48 are the same as the penetration portion 27 and the filling portion 30 of the first embodiment.

As described above with reference to FIGS. 5, 6A and 6B, the battery terminal 41 with current sensor has such a structure that the resin-molded part is not separated at the sensor part 45. By the structure, it is possible to prevent the overall outward appearance from being deteriorated, to enable the repetitive use and to exclude the influence due to the vibration, or the like.

In addition, the invention can be variously modified without departing from the gist of the invention.

In the above descriptions, the shapes of the post parts 6, 44 are just exemplary. For example, the shape of the post part disclosed in JP2002-141054A, which has been described in the related art, may be adopted.

What is claimed is:
1. A battery terminal with current sensor, comprising:
a battery terminal part that is formed by a conductive metal plate, and that includes a post part to be connected to a battery post of a battery;
a current sensor that includes a stud part to be connected to a load, and a first part and a second part extending from the battery terminal part in parallel, wherein the second part extends longer than the first part and an end of the second part further away from the battery terminal part is connected to the stud part;
a resin molding that integrates the battery terminal part and the current sensor; and
a sensor part that corresponds to an integrated part of the battery terminal part and the current sensor, wherein the sensor part includes a penetration portion constituting a hole or slit shape that is formed within a part of the battery terminal part enveloped by the resin molding, and a filling portion of the resin molding that is formed contiguous with the resin molding and fills the penetration portion.

2. The battery terminal with current sensor according to claim 1, wherein the sensor part and the stud part are arranged side by side in a direction orthogonal to a longitudinal axis of the battery terminal part.

3. The battery terminal with current sensor according to claim 2, wherein the penetration portion and the filling portion are arranged in a predetermined axis passing through the stud part and being parallel with the longitudinal axis of the battery terminal part.

4. The battery terminal with current sensor according to claim 1, wherein the sensor part and the stud part are arranged side by side along a longitudinal axis of the battery terminal part so that the sensor part is positioned closer to the post part than the stud part.

5. The battery terminal with current sensor according to claim 1, wherein
the penetration portion extends in a direction perpendicular to a direction of elongation of the battery terminal part.

6. The battery terminal with current sensor according to claim 5, wherein
the penetration portion extends substantially parallel to a direction in which the battery post of the battery is connected to the post part of the battery terminal part.

7. The battery terminal with current sensor according to claim 1, wherein
the second part of the current sensor extends in a first direction, and
the stud part of the current sensor extends from the end of the second part in a second direction substantially perpendicular to the first direction.

8. The battery terminal with current sensor according to claim 1, wherein the current sensor further includes a sensor block that has therein a current sensing circuit part and a connector part that is connected to the sensor block and protruded outside from the resin molding.

9. A battery terminal with current sensor, comprising:

a battery terminal part that is formed by a conductive metal plate, and a current sensor that is integrated with the battery terminal part by a resin molding, wherein the battery terminal part includes a first plate part and a second plate part, which are opposed to each other by bending the conductive metal plate, a post part that is to be connected to a battery post of a battery in a first direction, and an embrace part that is formed by bending the conductive metal plate at the post part, extends from one of the first plate part and the second plate part, and engages an other one of the first plate part and the second plate part so that the embrace part restrains the first plate part and the second plate part from being widened therebetween, and the battery terminal part further includes a pair of fastening parts formed by bending the conductive metal plate and connecting the first plate part and the second plate part, wherein a fastening bolt is inserted in bolt insertion penetration holes of the pair of the fastening parts from a second direction that is perpendicular to the first direction and fastened with a nut, and a part to be resin-molded, which corresponds to a part to which the current sensor is integrated by the resin molding, and a connection part, which corresponds to a part of connecting the part to be resin-molded to the first plate part, are formed at one side of the embrace part in the first plate part.

10. The battery terminal with current sensor according to claim 9, wherein the connection part is formed so that a width thereof is gradually widened from the one side of the embrace part toward the part to be resin-molded.

11. The battery terminal with current sensor according to claim 10, wherein the connection part is formed with a reinforcement part.

12. The battery terminal with current sensor according to claim 10, wherein the first plate part and the second plate part define planar surfaces that are substantially perpendicular to a direction in which the battery post of the battery is connected to the post part of the battery terminal part.

13. The battery terminal with current sensor according to claim 9, wherein the first plate part and the second plate part are opposed through bending of the conductive metal plate so that the first plate part and the second plate part are spaced apart in a direction in which the battery post of the battery is connected to the post part.

* * * * *